(12) United States Patent
Harasawa et al.

(10) Patent No.: US 9,912,300 B2
(45) Date of Patent: Mar. 6, 2018

(54) BIAS CONTROL CIRCUIT AND POWER AMPLIFICATION MODULE

(71) Applicant: Murata Manufacturing Co., Ltd., Kyoto (JP)

(72) Inventors: Yoshiaki Harasawa, Kyoto (JP); Fuminori Morisawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/435,442

(22) Filed: Feb. 17, 2017

(65) Prior Publication Data
US 2017/0179892 A1    Jun. 22, 2017

Related U.S. Application Data

(63) Continuation of application No. PCT/JP2015/062928, filed on Apr. 30, 2015.

(30) Foreign Application Priority Data

Aug. 28, 2014   (JP) ................................. 2014-174260

(51) Int. Cl.
*H03F 1/30* (2006.01)
*H03F 3/24* (2006.01)
(Continued)

(52) U.S. Cl.
CPC .............. *H03F 1/30* (2013.01); *H03F 1/301* (2013.01); *H03F 3/245* (2013.01);
(Continued)

(58) Field of Classification Search
USPC ........................................ 330/289, 285, 296
See application file for complete search history.

(56) References Cited

U.S. PATENT DOCUMENTS 6,879,214 B2 *   4/2005   LeSage ................... H03F 1/302
                                                            330/289

FOREIGN PATENT DOCUMENTS

| JP | H0376405 A | 4/1991 |
| JP | 2009218996 A | 9/2009 |
| JP | 2009296236 A | 12/2009 |

OTHER PUBLICATIONS

International Search Report for PCT/JP2015/062928 dated Jun. 30, 2015.
Written Opinion for PCT/JP2015/062928 dated Jun. 30, 2015.

* cited by examiner

*Primary Examiner* — Hieu Nguyen
(74) *Attorney, Agent, or Firm* — Pearne & Gordon LLP

(57) ABSTRACT

Provided is a bias control circuit that includes: a reference voltage circuit that generates a reference voltage; a resistor; a temperature dependent current generating circuit that generates a temperature dependent current, which changes depending on temperature, on the basis of the reference voltage and that supplies the temperature dependent current to one end of the resistor; a reference voltage buffer circuit that applies the reference voltage to the other end of the resistor; a constant current generating circuit that generates a constant current, which is for driving the reference voltage buffer circuit, on the basis of the reference voltage and that supplies the constant current to the other end of the resistor; and a bias generating circuit that generates a bias voltage or a bias current for a power amplification circuit on the basis of the voltage at the one end of the resistor.

12 Claims, 6 Drawing Sheets

(51) Int. Cl.
*H03F 3/04* (2006.01)
*H03F 1/52* (2006.01)
(52) U.S. Cl.
CPC .. *H03F 2200/451* (2013.01); *H03F 2200/528* (2013.01); *H03F 2200/555* (2013.01)

BIAS CONTROL CIRCUIT AND POWER AMPLIFICATION MODULE

This application is a continuation of International Application No. PCT/JP2015/062928 filed on Apr. 30, 2015 which claims priority from Japanese Patent Application No. 2014-174260 filed on Aug. 28, 2014. The contents of these applications are incorporated herein by reference in their entireties.

BACKGROUND

Technical Field

The present disclosure relates to a bias control circuit and a power amplification module.

A power amplification module is used in a mobile communication device such as a cellular phone in order to amplify the power of a radio frequency (RF) signal to be transmitted to a base station. In such a power amplification module, a bias voltage or a bias current to be supplied to a power amplification circuit may be given temperature dependence.

For example, Patent Document 1 discloses a configuration in which a current, which is obtained by combining a constant current and a current that has temperature dependence, is converted into a voltage by being supplied to a resistor, one end of which is grounded, and a bias voltage or bias current having temperature dependence is generated on the basis of the voltage.

Patent Document 1: Japanese Unexamined Patent Application Publication No. 2009-218996

BRIEF SUMMARY

In the configuration disclosed in Patent Document 1, a current mirror circuit is generally used when generating a constant current from a bandgap reference voltage. When a current mirror circuit is used in this way, if variations occur in the ratio of the sizes of the transistors that form the current mirror circuit due to variations in the manufacture of the transistors, variations will also occur in the constant current. Furthermore, if variations occur in the constant current, variations will also occur in the bias voltage or bias current.

For example, a typical method of suppressing the effect of such variations is a method in which the resistance value of a resistor, which is provided in the circuit that generates a constant current, is adjusted in response to the variations. However, with this method, the manufacturing process becomes complex and an increase in manufacturing cost is incurred.

The present disclosure was made in light of such circumstances and was made to suppress fluctuations in a bias voltage or bias current that occur with manufacturing variations and to suppress an increase in cost.

A bias control circuit according to an embodiment of the present disclosure includes: a reference voltage circuit that generates a reference voltage; a resistor; a temperature dependent current generating circuit that generates a temperature dependent current, which changes depending on temperature, on the basis of the reference voltage and that supplies the temperature dependent current to one end of the resistor; a reference voltage buffer circuit that applies the reference voltage to the other end of the resistor; a constant current generating circuit that generates a constant current, which is for driving the reference voltage buffer circuit, on the basis of the reference voltage and that supplies the constant current to the other end of the resistor; and a bias generating circuit that generates a bias voltage or a bias current for a power amplification circuit on the basis of a voltage at the one end of the resistor.

According to the present disclosure, fluctuations in the bias voltage or bias current that occur with manufacturing variations can be suppressed and an increase in manufacturing cost can be suppressed.

DETAILED DESCRIPTION

Figure 1:
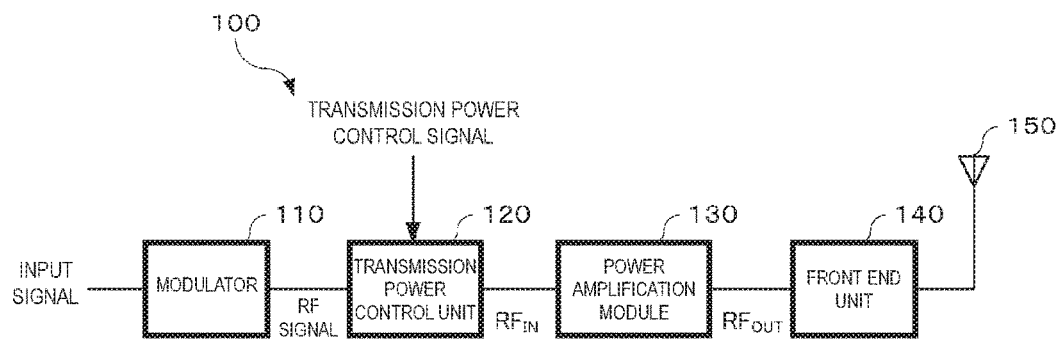
FIG. 1 illustrates an example configuration of a transmission unit that includes a power amplification module according to an embodiment of the present disclosure.

Hereafter, an embodiment of the present disclosure will be described while referring to the drawings. FIG. 1 illustrates an example configuration of a transmission unit that includes a power amplification module according to an embodiment of the present disclosure. A transmission unit 100 is for example used in a mobile communication device such as a cellular phone in order to transmit various signals such as speech and data to a base station. Although such a mobile communication device would also be equipped with a reception unit for receiving signals from the base station, the description of such a reception unit will be omitted here.

As illustrated in FIG. 1, the transmission unit 100 includes a modulator 110, a transmission power control unit 120, a power amplification module 130, a front end unit 140 and an antenna 150.

The modulator 110 modulates an input signal on the basis of a modulation scheme such as high speed uplink packet access (HSUPA) or long term evolution (LTE) and generates a radio frequency (RF) signal for performing wireless transmission. The RF signal has a frequency of around several hundred MHz to several GHz, for example.

The transmission power control unit 120 adjusts the power of the RF signal on the basis of a transmission power control signal and outputs an adjusted signal. For example, the transmission power control signal is generated on the basis of an adaptive power control (APC) signal transmitted from a base station. For example, the base station can transmit an APC signal to a mobile communication device as a command for adjusting the transmission power in the mobile communication device to an appropriate level by measuring a reception signal from the mobile communication device.

The power amplification module 130 amplifies the power of an RF signal ($RF_{IN}$) output from the transmission power control unit 120 up to the level that is required to transmit the RF signal to the base station, and outputs an amplified signal ($RF_{OUT}$).

The front end unit 140 filters the amplified signal and switches a reception signal received from the base station. The amplified signal output from the front end unit 140 is transmitted to the base station via the antenna 150.

Figure 2:
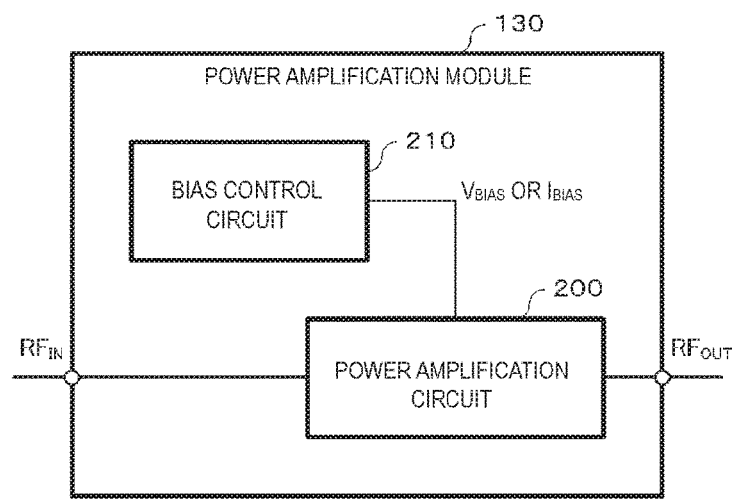
FIG. 2 illustrates an example of the configuration of the power amplification module.

FIG. 2 illustrates an example of the configuration of the power amplification module 130. The power amplification module 130 includes a power amplification circuit 200 and a bias control circuit 210. The power amplification circuit 200 amplifies the power of the RF signal ($RF_{IN}$) and outputs the amplified signal ($RF_{OUT}$). The bias control circuit 210 supplies a bias voltage $V_{BIAS}$ or a bias current $I_{BIAS}$ to the power amplification circuit 200.

In the case where the bias voltage $V_{BIAS}$ or the bias current $I_{BIAS}$ is constant, the gain of the power amplification circuit 200 has a characteristic of changing in response to the temperature. Therefore, in the power amplification module 130 of this embodiment, changes in the gain of the power amplification circuit 200 that occur in response to the temperature are suppressed by giving the bias voltage $V_{BIAS}$ or the bias current $I_{BIAS}$ temperature dependence.

Figure 3:
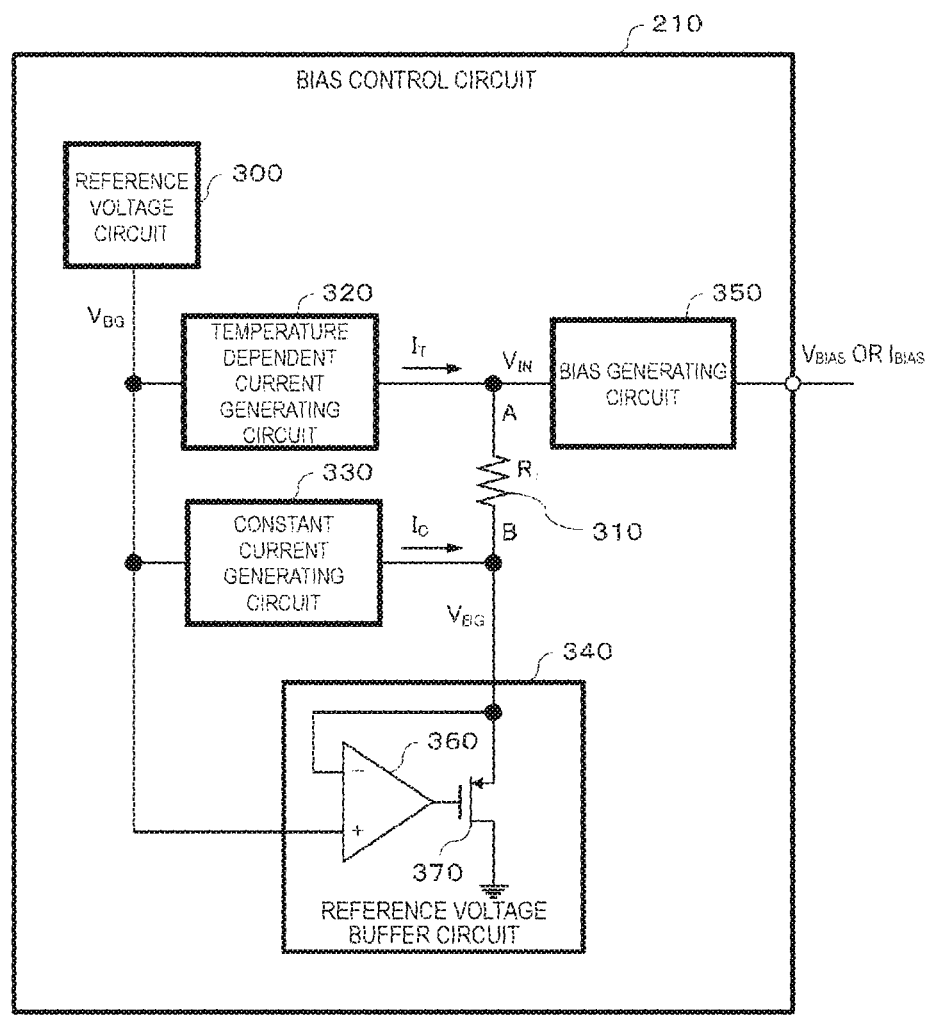
FIG. 3 illustrates an example of the configuration of a bias control circuit.

FIG. 3 illustrates an example of the configuration of the bias control circuit 210. The bias control circuit 210 includes a reference voltage circuit 300, a resistor 310, a temperature dependent current generating circuit 320, a constant current generating circuit 330, a reference voltage buffer circuit 340 and a bias generating circuit 350.

The reference voltage circuit 300 generates a band gap reference voltage $V_{BG}$ (hereafter, simply referred to as "reference voltage") that does not depend upon the temperature. The reference voltage $V_{BG}$ is around 1.2 V, for example.

The temperature dependent current generating circuit 320 generates a temperature dependent current $I_T$ on the basis of the reference voltage $V_{BG}$. The temperature dependent current $I_T$ changes depending on the temperature. The temperature dependent current $I_T$ is supplied to one end (A side) of the resistor 310. An example of the configuration of the temperature dependent current generating circuit 320 will be described later.

The constant current generating circuit 330 generates a constant current $I_C$ on the basis of the reference voltage $V_{BG}$. The constant current $I_C$ is supplied to the other end (B side) of the resistor 310. The constant current $I_C$ is used to drive the reference voltage buffer circuit 340. An example of the configuration of the constant current generating circuit 330 will be described later.

The reference voltage buffer circuit 340 applies the reference voltage $V_{BG}$ to the other end (B side) of the resistor 310. The reference voltage buffer circuit 340 includes an operational amplifier 360 and a P-channel MOSFET 370, for example. The reference voltage $V_{BG}$ is applied to the non-inverting input terminal of the operational amplifier 360, the inverting input terminal of the operational amplifier 360 is connected to the source of the P-channel MOSFET 370 and the output terminal of the operational amplifier 360 is connected to the gate of the P-channel MOSFET 370. The source of the P-channel MOSFET 370 is connected to the other end (B side) of the resistor 310 and P-channel MOSFET 370 has a common drain configuration. The reference voltage buffer circuit 340 operates such that the inverting input terminal of the operational amplifier 360 comes to be at the reference voltage $V_{BG}$ due to imaginary short circuiting of the operational amplifier 360. Thus, the reference voltage $V_{BG}$ is applied to the other end (B side) of the resistor 310.

The bias generating circuit 350 generates the bias voltage $V_{BIAS}$ or the bias current $I_{BIAS}$ for the power amplification circuit 200 on the basis of a voltage $V_{IN}$ at the one end of the resistor 310. An example of the configuration of the bias generating circuit 350 will be described later.

In the bias control circuit 210, the reference voltage buffer circuit 340 controls the voltage at the other end (B side) of the resistor 310 to be the reference voltage $V_{BG}$. Therefore, the voltage $V_{IN}$ at the one end (A side) of the resistor 310 is given by $V_{IN}=V_{BG}+I_T \times R_1$, where $R_1$ is the resistance value of the resistor 310. Since the reference voltage $V_{BG}$ is dominant in the voltage $V_{IN}$, fluctuations in the voltage $V_{IN}$ caused by fluctuations in the temperature dependent current $I_T$ caused by variations are suppressed.

Figure 4:
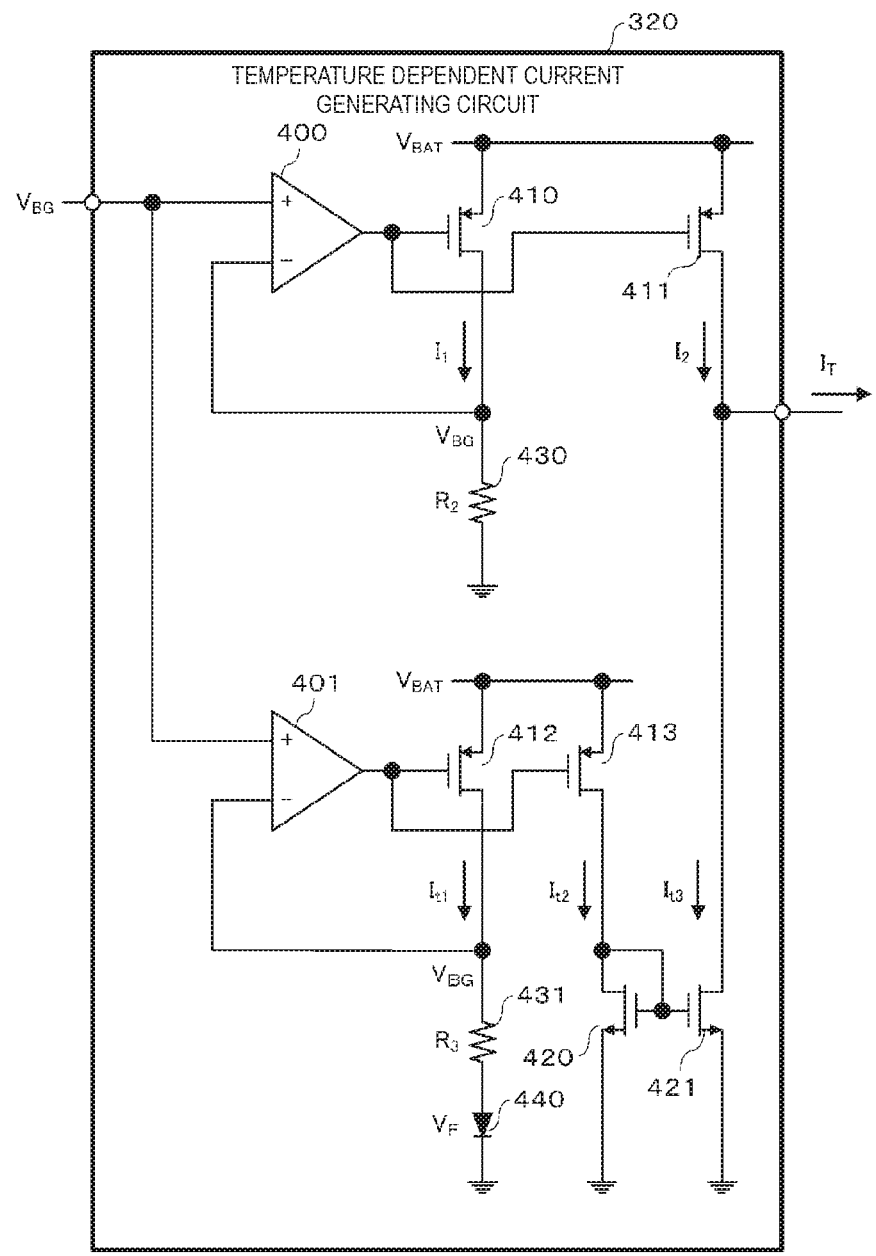
FIG. 4 illustrates an example of the configuration of a temperature dependent current generating circuit.

FIG. 4 illustrates an example of the configuration of the temperature dependent current generating circuit 320. The temperature dependent current generating circuit 320 includes operational amplifiers 400 and 401, P-channel MOSFETs 410, 411, 412 and 413, N-channel MOSFETs 420 and 421, resistors 430 and 431 and a diode 440.

The reference voltage $V_{BG}$ is applied to the non-inverting input terminal of the operational amplifier 400, the inverting input terminal of the operational amplifier 400 is connected to a connection point between the drain of the P-channel MOSFET 410 and the resistor 430, and the output terminal of the operational amplifier 400 is connected to the gate of the P-channel MOSFET 410. A battery voltage $V_{BAT}$ is applied to the source of the P-channel MOSFET 410 and the drain of the P-channel MOSFET 410 is connected to one end of the resistor 430. The battery voltage $V_{BAT}$ is applied to the source of the P-channel MOSFET 411, the drain of the P-channel MOSFET 411 is connected to the drain of the N-channel MOSFET 421 and the gate of the P-channel MOSFET 411 is connected to the gate of the P-channel MOSFET 410. The one end of the resistor 430 is connected to the inverting input terminal of the operational amplifier 400 and the other end of the resistor 430 is grounded.

The reference voltage $V_{BG}$ is applied to the non-inverting input terminal of the operational amplifier 401, the inverting input terminal of the operational amplifier 401 is connected to a connection point between the drain of the P-channel MOSFET 412 and the resistor 431, and the output terminal of the operational amplifier 401 is connected to the gate of the P-channel MOSFET 412. The battery voltage $V_{BAT}$ is applied to the source of the P-channel MOSFET 412 and the drain of the P-channel MOSFET 412 is connected to one end of the resistor 431. The battery voltage $V_{BAT}$ is applied to the source of the P-channel MOSFET 413, the drain of the P-channel MOSFET 413 is connected to the drain of the N-channel MOSFET 420 and the gate of the P-channel MOSFET 413 is connected to the gate of the P-channel MOSFET 412. The N-channel MOSFET 420 is diode-connected in series with the P-channel MOSFET 413 and the N-channel MOSFET 420 has a common-source configuration. The drain of the N-channel MOSFET 421 is connected to the drain of the P-channel MOSFET 411, the N-channel MOSFET 421 has a common-source configuration, and the gate of the N-channel MOSFET 421 is connected to the gate of the N-channel MOSFET 420. The one end of the resistor 431 is connected to the inverting input terminal of the operational amplifier 401 and the other end of the resistor 431 is connected to the anode of the diode 440. In addition, the cathode of the diode 440 is grounded.

In the configuration illustrated in FIG. 4, a current $I_1$ that flows through the P-channel MOSFET 410 is given by $I_1=V_{BG}/R_2$ (constant current), where $R_2$ is the resistance value of the resistor 430. A current $I_2$ that flows through the P-channel MOSFET 411 is given by $I_2=k_1 \times I_1$ (constant current). $k_1$ is a coefficient that corresponds to a ratio of the sizes of the P-channel MOSFETs 410 and 411.

In addition, a current $I_{t1}$ that flows through the P-channel MOSFET 412 is given by $I_{t1}=(V_{BG}-V_F)/R_3$, where $R_3$ is the resistance value of the resistor 431 and $V_F$ is the forward voltage of the diode 440. A current $I_{t2}$ that flows through the P-channel MOSFET 413 is given by $I_{t2}=k_2 \times I_{t1}$. $k_2$ is a coefficient that corresponds to a ratio of the sizes of the P-channel MOSFETs 412 and 413. Furthermore, a current $I_{t3}$ that flows through the N-channel MOSFET 421 is given by $I_{t3}=k_3 \times I_{t2}$. $k_3$ is a coefficient that corresponds to a ratio of the sizes of the N-channel MOSFETs 420 and 421. Here, since $V_F$ changes in accordance with the temperature, the currents $I_{t1}$ to $I_{t3}$ also change in accordance with the temperature.

The temperature dependent current generating circuit 320 outputs the temperature dependent current $I_T$ from a connection point between the P-channel MOSFET 411 and the N-channel MOSFET 421. In other words, $I_T=I_2-I_{t3}$. $I_T$ is positive in the case where $I_2>I_{t3}$ and is negative in the case where $I_2<I_{t3}$.

Figure 5:
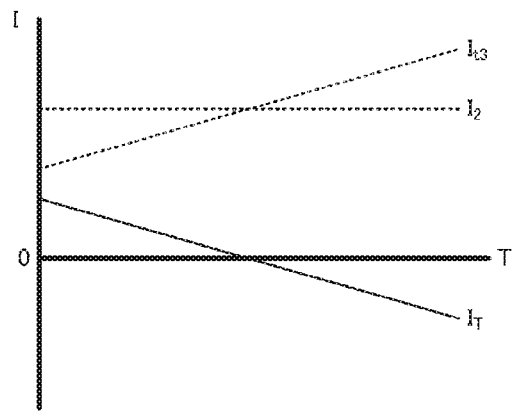
FIG. 5 illustrates an example of how the temperature dependent current changes.

FIG. 5 illustrates an example of how the temperature dependent current $I_T$ changes. Assuming that the forward voltage $V_F$ of the diode 440 decreases in response to an increase in temperature, the current $I_{t3}$ increases in response to an increase in temperature. Since the temperature dependent current $I_T$ is given by $I_T=I_2-I_{t3}$, as illustrated in FIG. 5, the temperature dependent current $I_T$ decreases in response to an increase in temperature. For example, $I_2=I_{t3}$ at room temperature (25° C.) and the temperature dependent current $I_T$ is zero.

Figure 6:
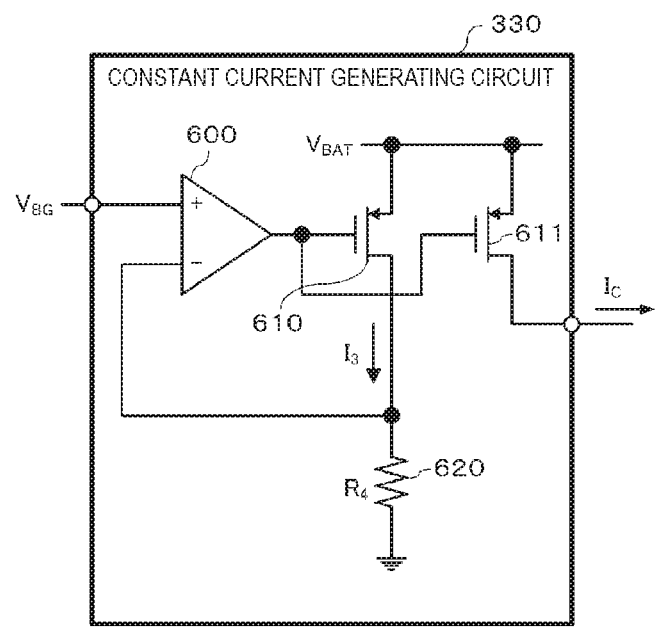
FIG. 6 illustrates an example of the configuration of a constant current generating circuit.

FIG. 6 illustrates an example of the configuration of the constant current generating circuit 330. The constant current generating circuit 330 includes an operational amplifier 600, P-channel MOSFETs 610 and 611 and a resistor 620.

The reference voltage $V_{BG}$ is applied to the non-inverting input terminal of the operational amplifier 600, the inverting input terminal of the operational amplifier 600 is connected to a connection point between the drain of the P-channel MOSFET 610 and the resistor 620, and the output terminal of the operational amplifier 600 is connected to the gate of the P-channel MOSFET 610. The battery voltage $V_{BAT}$ is applied to the source of the P-channel MOSFET 610 and the drain of the P-channel MOSFET 610 is connected to one end of the resistor 620. The battery voltage $V_{BAT}$ is applied to the source of the P-channel MOSFET 611 and the gate of the P-channel MOSFET 611 is connected to the gate of the P-channel MOSFET 610. The one end of the resistor 620 is connected to the inverting input terminal of the operational amplifier 600 and the other end of the resistor 620 is grounded.

In the configuration illustrated in FIG. 6, a current $I_3$ that flows though the P-channel MOSFET 610 is given by $I_3=V_{BG}/R_4$ (constant current), where $R_4$ is the resistance value of the resistor 620. A current $I_C$ output from the P-channel MOSFET 611 is given by $I_C=k_4 \times I_3$ (constant current). $k_4$ is a coefficient that corresponds to a ratio of the sizes of the P-channel MOSFETs 610 and 611.

Figure 7:
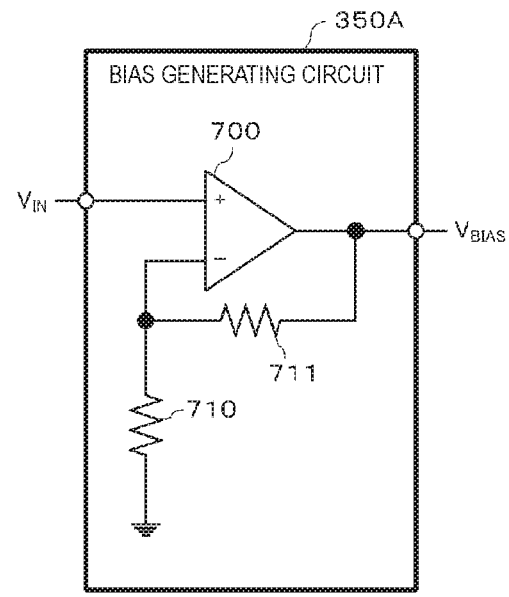
FIG. 7 illustrates an example of the configuration of a bias generating circuit.

FIG. 7 illustrates an example of the configuration of the bias generating circuit 350. A bias generating circuit 350A includes an operational amplifier 700 and resistors 710 and 711. The voltage $V_{IN}$ is applied to the non-inverting input terminal of the operational amplifier 700. One end of the resistor 710 is connected to the inverting input terminal of the operational amplifier 700 and the other end of the resistor 710 is grounded. One end of the resistor 711 is connected to the inverting input terminal of the operational amplifier 700 and the other end of the resistor 711 is connected to the output terminal of the operational amplifier 700.

In the configuration illustrated in FIG. 7, the operational amplifier 700 and the resistors 710 and 711 form a non-inverting amplification circuit, and the bias voltage $V_{BIAS}$ is output, the bias voltage VBIAS being obtained by amplifying the voltage $V_{IN}$ with a gain corresponding to the resistance values of the resistors 710 and 711.

Figure 8:
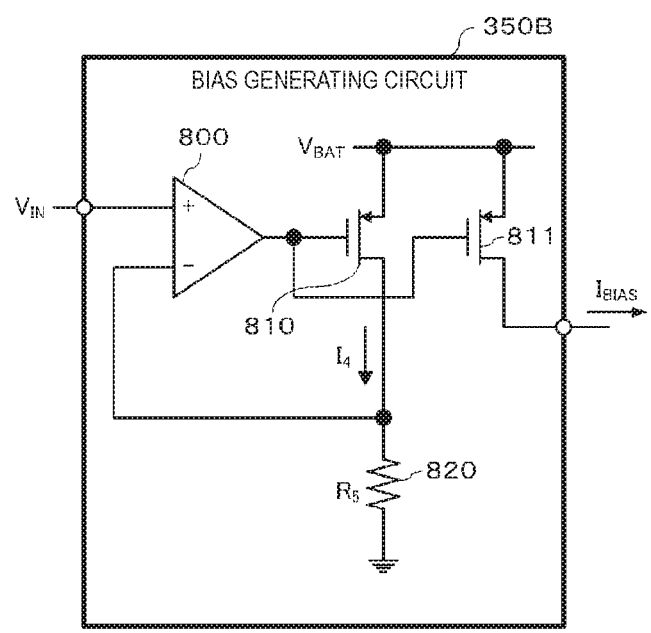
FIG. 8 illustrates another example of the configuration of a bias generating circuit.

FIG. 8 illustrates another example of the configuration of the bias generating circuit 350. A bias generating circuit 350B includes an operational amplifier 800, P-channel MOSFETs 810 and 811 and a resistor 820.

The voltage $V_{IN}$ is applied to the non-inverting input terminal of the operational amplifier 800, the inverting input terminal of the operational amplifier 800 is connected to a connection point between the drain of the P-channel MOSFET 810 and the resistor 820, and the output terminal of the operational amplifier 800 is connected to the gate of the P-channel MOSFET 810. The battery voltage $V_{BAT}$ is applied to the source of the P-channel MOSFET 810 and the drain of the P-channel MOSFET 810 is connected to one end of the resistor 820. The battery voltage $V_{BAT}$ is applied to the source of the P-channel MOSFET 811 and the gate of the P-channel MOSFET 811 is connected to the gate of the P-channel MOSFET 810. The one end of the resistor 820 is connected to the inverting input terminal of the operational amplifier 800 and the other end of the resistor 820 is grounded.

In the configuration illustrated in FIG. 8, the bias generating circuit 350B forms a voltage-current converting circuit that converts the voltage $V_{IN}$ into the bias current $I_{BIAS}$ and outputs the bias current $I_{BIAS}$. A current $I_4$ that flows through the P-channel MOSFET 810 is given by $I_4=V_{IN}/R_5$, where $R_5$ is the resistance value of the resistor 820. The bias current $I_{BIAS}$ output from the P-channel MOSFET 811 is given by $I_{BIAS}=k_5 \times I_4$. $k_5$ is a coefficient that corresponds to a ratio of the sizes of the P-channel MOSFETs 810 and 811.

Figure 9:
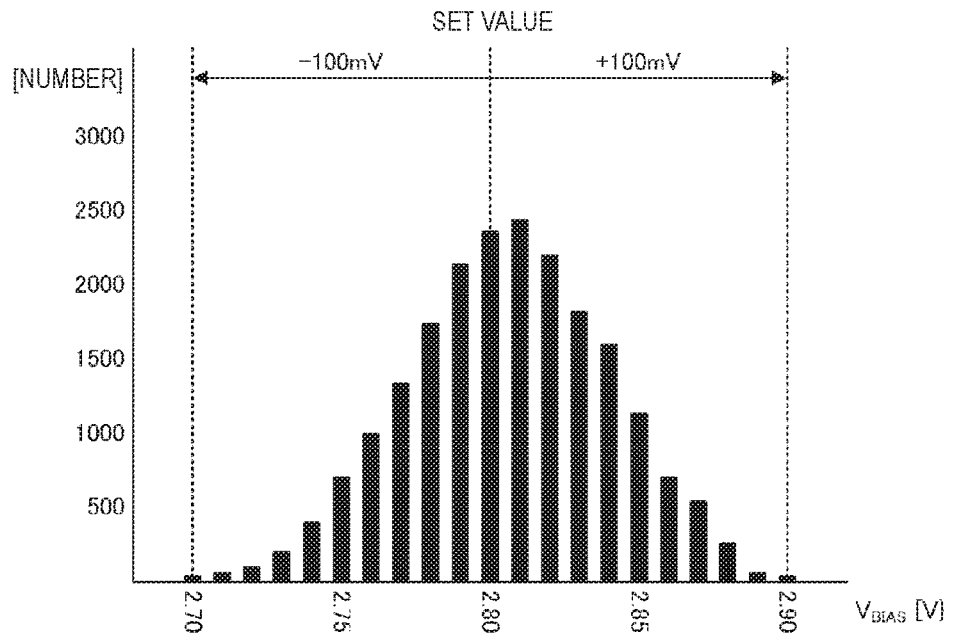
FIG. 9 illustrates an example of the distribution of variations in bias voltage in bias control circuits that generate a bias voltage having temperature dependence by converting a current, which is obtained by combining a constant current and a current that has temperature dependence, into a voltage by supplying the current to a resistor, one end of which is grounded, on the basis of the voltage.
Figure 10:
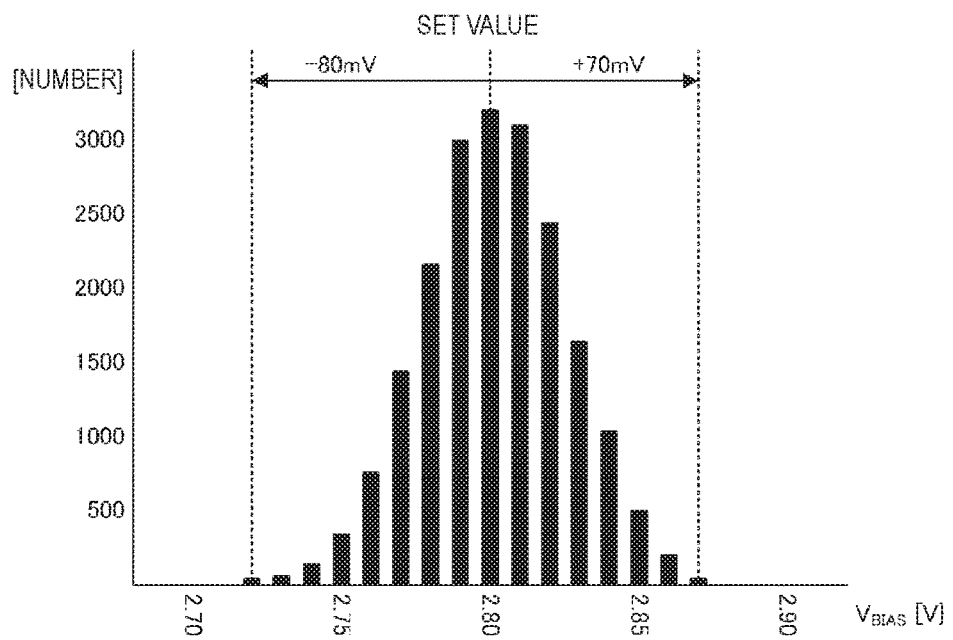
FIG. 10 illustrates an example of variations in bias voltage in a bias control circuit of the embodiment.

FIGS. 9 and 10 illustrate examples of the distribution of variations in the bias voltage $V_{BIAS}$ in bias control circuits. In FIGS. 9 and 10, the horizontal axis represents the bias voltage $V_{BIAS}$ and the vertical axis represents the number of bias control circuits. In FIGS. 9 and 10, the set value of the bias voltage $V_{BIAS}$ is 2.80 V.

FIG. 9 illustrates an example of the distribution of variations in the bias voltage $V_{BIAS}$ in bias control circuits that generate the bias voltage $V_{BIAS}$ having temperature dependence by converting a current obtained by combining a constant current and a current that has temperature dependence into a voltage by supplying the current to a resistor, one end of which is grounded, on the basis of the voltage. As illustrated in FIG. 9, the variations in the bias voltage $V_{BIAS}$ are around ±100 mV from the set value 2.80 V.

FIG. 10 illustrates an example of variations in the bias voltage $V_{BIAS}$ in the bias control circuit 210 of this embodiment. As illustrated in FIG. 10, the variations in the bias voltage $V_{BIAS}$ are around ±80 mV from the set value 2.80 V.

In other words, it is clear that the distribution of variations is smaller than in the example illustrated in FIG. 9.

An embodiment has been described above. According to the embodiment, in the bias control circuit 210, the reference voltage buffer circuit 340 controls the voltage at the other end (B side) of the resistor 310 so as to be the reference voltage $V_{BG}$. Thus, fluctuations in the bias voltage or the bias current can be suppressed compared with a configuration in which a temperature dependent current is supplied to a resistor, one end of which is grounded, and is consequently converted into a voltage, and a bias voltage or bias current having a temperature dependence is generated on the basis of the voltage. In addition, according to this embodiment, there is no need for a process of adjusting the resistance value in order to suppress the effect of such variations. Therefore, an increase in manufacturing cost can be suppressed.

This embodiment is for allowing the present disclosure to be easily understood and is not to be interpreted as limiting the present disclosure. The present disclosure can be modified or improved without departing from the gist of the disclosure and equivalents to the present disclosure are also included in the present invention.

REFERENCE SIGNS LIST 100 transmission unit
110 modulator
120 transmission power control unit
130 power amplification module
140 front end unit
150 antenna
200 power amplification circuit
210 bias control circuit
300 reference voltage circuit
310, 430, 431, 620, 710, 711, 820 resistor
320 temperature dependent current generating circuit
330 constant current generating circuit
340 reference voltage buffer circuit
350 bias generating circuit
400, 401, 600, 700, 800 operational amplifier
410, 411, 412, 413, 610, 611, 810, 811 P-channel MOSFET
420, 421 N-channel MOSFET
440 diode

The invention claimed is:

1. A bias control circuit comprising:
a reference voltage circuit that generates a reference voltage;
a resistor;
a temperature dependent current generating circuit that generates a temperature dependent current and that supplies the temperature dependent current to a first end of the resistor, the temperature dependent current being based on the reference voltage and changing depending on a temperature;
a reference voltage buffer circuit that applies the reference voltage to a second end of the resistor;
a constant current generating circuit that generates a constant current and the supplies the constant current to the second end of the resistor, for the constant current being based on the reference voltage and driving the reference voltage buffer circuit; and
a bias generating circuit that generates a bias voltage or a bias current for a power amplification circuit based on a voltage at the first end of the resistor.

2. The bias control circuit according to claim 1, wherein:
the reference voltage buffer circuit includes an operational amplifier and a P-channel MOSFET,
the reference voltage is applied to a first input terminal of the operational amplifier,
a second input terminal of the operational amplifier and a source of the P-channel MOSFET are connected to the second end of the resistor, and
an output terminal of the operational amplifier is connected to a gate of the P-channel MOSFET.

3. The bias control circuit according to claim 2, wherein the first input is a non-inverting input and the second input is an inverting input.

4. The bias control circuit according to claim 1,
wherein the bias generating circuit includes an amplification circuit that amplifies the voltage at the first end of the resistor and outputs the bias voltage.

5. The bias control circuit according to claim 2,
wherein the bias generating circuit includes an amplification circuit that amplifies the voltage at the first end of the resistor and outputs the bias voltage.

6. The bias control circuit according to claim 1,
wherein the bias generating circuit includes a voltage-current converting circuit that converts the voltage at the first end of the resistor into the bias current.

7. The bias control circuit according to claim 2,
wherein the bias generating circuit includes a voltage-current converting circuit that converts the voltage at the first end of the resistor into the bias current.

8. The bias control circuit according to claim 1,
wherein the temperature dependent current generating circuit includes a second resistor, a third resistor, and a diode, and
the temperature dependent current is based in part on a product of a coefficient and a difference between the reference voltage and a forward voltage of the diode.

9. The bias control circuit according to claim 8, wherein:
the temperature dependent current generating circuit further includes four P-channel MOSFETs and two N-channel MOSFETs, and
the coefficient corresponds to ratios of sizes of the four P-channel MOSFETs and two N-channel MOSFETs.

10. The bias control circuit according to claim 1, wherein:
the constant current generating circuit includes a second resistor, and
the constant current is equal to a product of a coefficient and the reference voltage divided by a resistance of the second resistor.

11. The bias control circuit according to claim 10, wherein:
the constant current generating circuit further includes two P-channel MOSFETs, and
the coefficient corresponds to a ratio of sizes of the two P-channel MOSFETs.

12. A power amplification module comprising:
the bias control circuit according to claim 1; and
a power amplification circuit that amplifies an input signal on the basis of the bias voltage or the bias current output from the bias control circuit and outputs the amplified input signal.

* * * * *